(12) United States Patent
Yang

(10) Patent No.: US 6,745,316 B1
(45) Date of Patent: Jun. 1, 2004

(54) DATA PROCESSING SYSTEM

(75) Inventor: Charles Yang, Hsinchu (TW)

(73) Assignee: Winbond Electronics Corporation, Hsinchu (TW)

(*) Notice: Subject to any disclaimer, the term of this patent is extended or adjusted under 35 U.S.C. 154(b) by 820 days.

(21) Appl. No.: 09/688,440

(22) Filed: Oct. 16, 2000

(30) Foreign Application Priority Data

Dec. 20, 1999 (TW) .......................................... 88122455 A

(51) Int. Cl.$^7$ .............................................. G06F 12/00
(52) U.S. Cl. .............................. 712/1; 712/247; 711/1; 711/220
(58) Field of Search ........................... 711/1, 214, 220; 712/1, 230, 245, 247

(56) References Cited

U.S. PATENT DOCUMENTS

| | | | | |
|---|---|---|---|---|
| 5,274,278 A | * | 12/1993 | Bauer et al. ................ | 326/106 |
| 5,546,343 A | * | 8/1996 | Elliott et al. ............ | 365/189.04 |
| 5,831,900 A | * | 11/1998 | Miyamoto .............. | 365/185.03 |
| 5,943,693 A | * | 8/1999 | Barth ......................... | 711/220 |
| 5,953,738 A | * | 9/1999 | Rao ............................ | 711/105 |
| 6,038,166 A | * | 3/2000 | Wong ..................... | 365/185.03 |
| 6,297,988 B1 | * | 10/2001 | Parker et al. .......... | 365/185.03 |
| 6,341,347 B1 | * | 1/2002 | Joy et al. ................... | 712/228 |
| 6,532,556 B1 | * | 3/2003 | Wong et al. ................ | 714/702 |
| 6,629,236 B1 | * | 9/2003 | Aipperspach et al. ....... | 712/228 |

* cited by examiner

Primary Examiner—William Treat
(74) Attorney, Agent, or Firm—Knoble Yoshida & Dunleavy, LLC

(57) ABSTRACT

A data processing system is disclosed. The system includes a control command storage device, a data storage device, an address pointer, a multi-level signal decoder and a data processing unit. The control command storage device and the data storage device store the data to be processed in a multi-level data form. The address pointer is electrically connected to the control command storage device and the data storage device for pointing toward a first address of the control command storage device and a second address of the data storage device. The multi-level signal decoder is electrically connected to the control command storage device for decoding a control command stored in an n-level data form and read from the first address of the control command storage device, thereby delivering a control signal representing the corresponding control command. The data processing unit is electrically connected to the multi-level signal decoder and the data storage device for processing data stored in an m-level data form and read from the second address of the data storage device, thereby delivering an output signal.

30 Claims, 13 Drawing Sheets

DATA PROCESSING SYSTEM

FIELD OF THE INVENTION

The present invention relates to a data processing system, and more particularly, to a multi-level data processing system suitable for signal synthetic processing.

BACKGROUND OF THE INVENTION

Many memory devices for storing data in a binary system are widely known in the art; thus, it is common to process and store various types of data with a digital computer. A central processing unit (CPU), also called a processor, is customarily used to read and execute a command; thus, it is a considerably important component in a digital computer. FIG. 1 is a typical schematic diagram showing the interconnection of a central processing unit 11. The central processing unit essentially includes a control unit 111, an arithmetic logical unit 112 and a register unit 113. The control unit 111 is used to control the operation of the central processing unit 11. The arithmetic logical unit 112 is used to conduct the arithmetic calculation of the computer. And the register unit 113 is used to be a memory unit of the central processing unit 11. Owing to the interconnection of the control unit 111, the arithmetic logical unit 112 and the register unit 113, the data transmissions among such units are proceeded so as to perform the overall data processing.

However, in the circuit device for storing and processing data in a binary system, the number of storage cell is usually not sufficient, because the data stored in a binary system having two level signals representing 0 or 1, are considerable. Especially, the large amounts of storage cells are required for storing the increasingly utilized sound signals. Furthermore, using the traditional central processing unit to process sound signals still has too many difficulties to cope with.

Because storing analog signals requires less memory space than storing digital data, the use of analog memory for storing digital data as multi-level voltage signals has been attempt ed to overcome the problem described.

SUMMARY OF THE INVENTION

An object of the present invention is to provide an improved data processing system by using a multi-level memory cell.

Another object of the present invention is to provide a data processing system for storing and processing sound signals.

The present system comprises a control command storage device, a data storage device, an address pointer, a multi-level signal decoder and a data processing unit. The control command storage device is used to store a control command in an n-level form, wherein n is an integer and at least 2. The data storage device is used to store the data to be processed in an m-level data form, wherein m is an integer and greater than 2. Preferably, both m and n are greater than 2. The address pointer is electrically connected to the control command storage device and the data storage device for pointing toward a first address of the control command storage device and a second address of the data storage device. The multi-level signal decoder is electrically connected to the control command storage device for decoding a control command stored in an n-level data form and read from the first address of the control command storage device, thereby delivering a control signal representing the meaning of the corresponding control command. The data processing unit is electrically connected to the multi-level signal decoder and the data storage device for processing data stored in an m-level data form and read from the second address of the data storage device, thereby delivering an output signal.

Preferably, the control command storage device is a multi-level memory cell. However, the control command storage device is a digital memory cell such as a dynamic random access memory (DRAM) when n is equal to 2.

The address pointer preferably includes a column address device and a row address device.

Preferably, the multi-level decoder comprises a plurality of level comparators. The number of level comparators depends on the number of level signals to be decoded.

The data processing unit comprises a multi-level data register and a multi-level data processor. The multi-level data register is electrically connected to the data storage device for storing data in an m-level data form. The multi-level data processor is electrically connected to the multi-level data register and the multi-level signal decoder for processing the data stored in the multi-level data register in an m-level data form in response to the command signal and delivering an output signal. Owing to the difference of the control signals, the processing of the multi-level data processor includes a variety of operations, for example adding, subtracting, zeroing and maintaining unchanged. When the processing relates to an operation such as zeroing or maintaining unchanged, the multi-level data processor delivers an analog address signal and at this situation the multi-level data processor further includes an analog-to-digital converter and a program counter. The analog-to-digital converter is electrically connected to the multi-level data processor for converting the analog address signal to a digital address signal, and then the digital address signal is delivered to a program counter. The program counter is electrically connected to the analog-to-digital converter and the address pointer for delivering a counting signal to the address pointer in response to the digital address signal, and it further controls the address pointer to point toward the corresponding addresses of the control command storage device and the data storage device.

In accordance with an aspect of the present invention, the control command storage device is a tri-level memory cell, which stores the operational control commands representing "0", "+" and "−" in small, medium and large voltage-level signal forms, respectively. Preferably, the multi-level decoder comprises two comparators. The first voltage comparator is electrically connected to the tri-level memory cell and a first fixed reference voltage V0 for delivering a high-level voltage signal representing one of "0", "+" and "−" operational control commands such as "0", when the voltage-level signal read from the tri-level memory cell is a small voltage-level signal and smaller than the first fixed reference voltage V0. The second voltage comparator is electrically connected to the tri-level memory cell and a second fixed reference voltage V1 for delivering a high-level voltage signal representing one of "0", "+" and "−" operational control commands such as "+", when the voltage-level signal read from the tri-level memory cell is a medium voltage-level signal and smaller than said second fixed reference voltage V1. On the contrary, it delivers a low-level voltage signal representing one of "0", "+" and "−" operational control commands such as "−", when the voltage-level signal read from said tri-level memory cell is a large voltage-level signal and greater than the second fixed reference voltage V1. The data storage device is used to store an m-level voltage signal representing amplitude difference of the output signal. Certainly, under the similar configuration, the data processing system can be varied for storing the operational control commands representing "N" (i.e. maintaining unchanged), "+" and "−".

In accordance with another aspect of the present invention, the control command storage device is a quartet-level memory cell for storing the operational control commands representing "N", "+", "−", and "0" in four voltage-level signal forms. Preferably, the multi-level decoder comprises three comparators. The first voltage comparator is electrically connected to the quartet-level memory cell and a first fixed reference voltage V0 for delivering a high-level voltage signal representing one of "N", "0", "+" and "−" operational control commands such as "N", when the voltage-level signal read from the quartet-level memory cell is smaller than the first fixed reference voltage V0. The second voltage comparator is electrically connected to the quartet-level memory cell and a second fixed reference voltage V1 for delivering a high-level voltage signal representing one of "N", "0", and "−" operational control commands such as "+", when the voltage-level signal read from the quartet-level memory cell is greater than the first fixed reference voltage V0 and smaller than the second fixed reference voltage V1. The third voltage comparator is electrically connected to the quartet-level memory cell and a third fixed reference voltage V2 for delivering a high-level voltage signal representing one of "N", "0", "+" and "−" operational control commands such as "−", when the voltage-level signal read from the quartet-level memory cell is greater than the first second reference voltage and smaller than the third fixed reference voltage V2. On the contrary, it delivers a low-level voltage signal representing "0" operational control command when the voltage-level signal read from the quartet-level memory cell is greater than the third fixed reference voltage V2.

The above objects of the present invention will become more readily apparent to those ordinarily skilled in the art after reviewing the following detailed description and accompanying drawings, in which:

DETAILED DESCRIPTION OF THE PREFERRED EMBODIMENT

Figure 1:
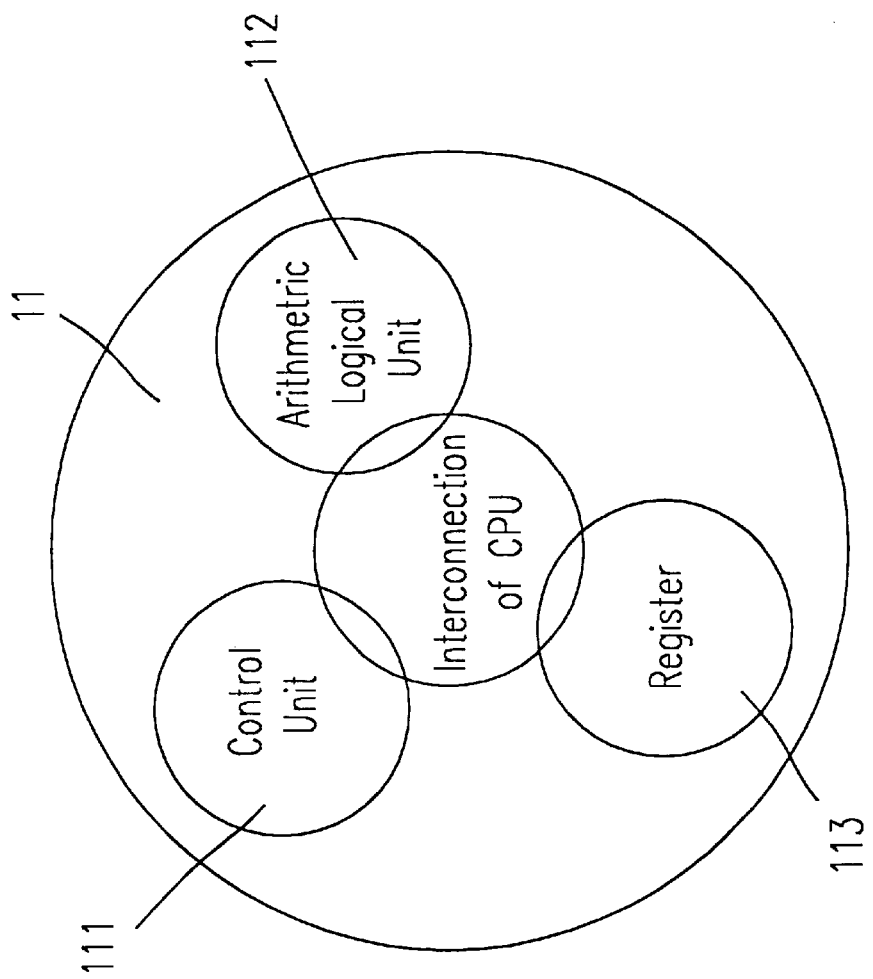
FIG. 1 is a schematic diagram illustrating the interconnection of a typical central processing unit.
Figure 2:
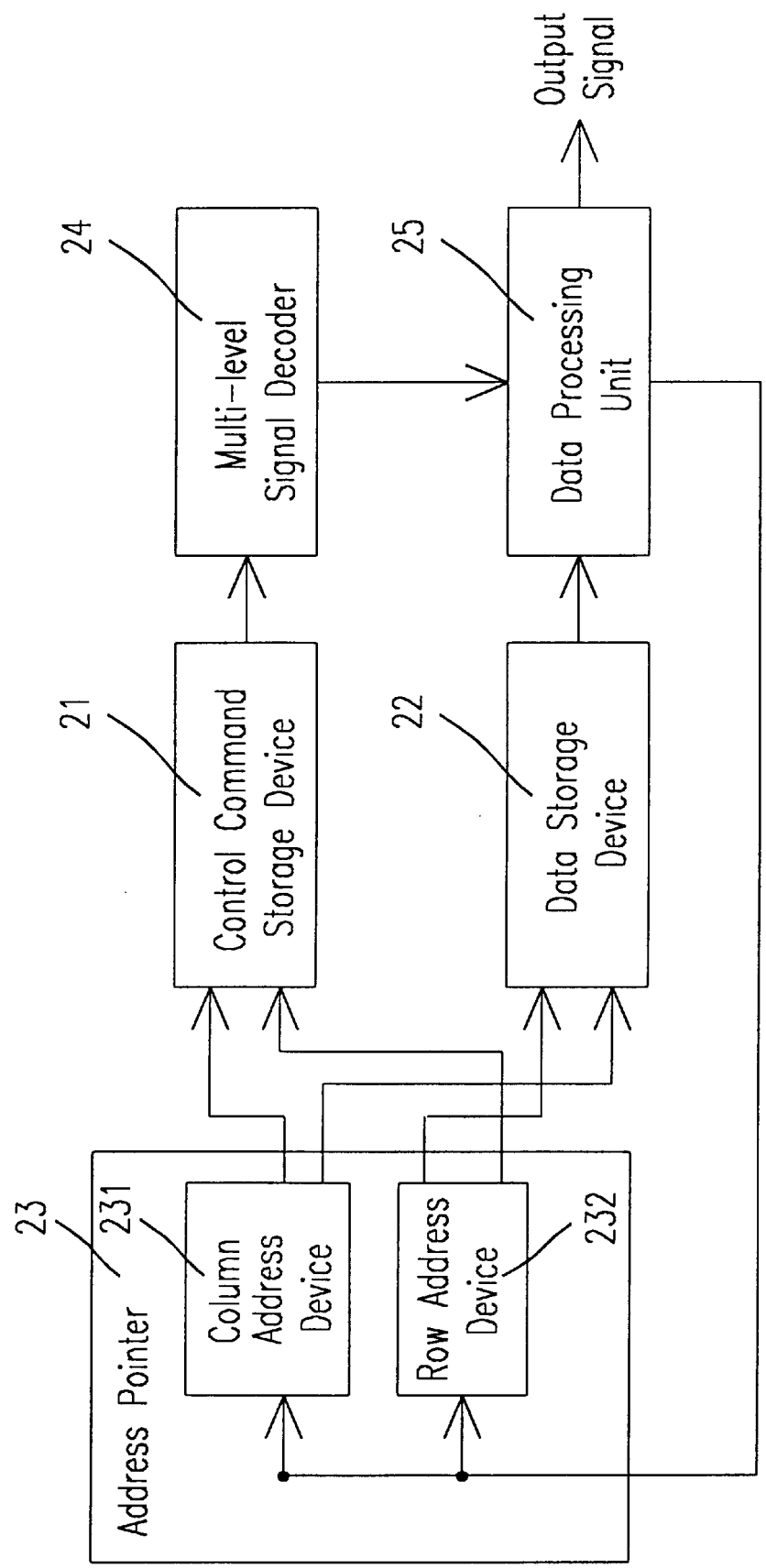
FIG. 2 is a function block diagram of a circuit of a data processing system according to the first embodiment of the present invention.

FIG. 2 is a function block diagram of a circuit of a data processing system according to the first embodiment of the present invention. The data processing system shown in FIG. 2 comprises a control command storage device 21, a data storage device 22, an address pointer 23, a multi-level signal decoder 24 and a data processing unit 25. The address pointer 23 is electrically connected to the control command storage device 21 and the data storage device 22, and the address pointer 23 further comprises a column address device 231 and a row address device 232. The control command is stored in the control command storage device 21 in an n-level data form, wherein n is an integer and greater than 2. Preferably, the control command storage device 21 is a multi-level memory cell for storing a multi-level voltage signal. Furthermore, the data storage device 22 is also a multi-level memory cell for storing data to be processed in an m-level data form, wherein m is an integer and greater than 2. The column address device 231 and the row address device 232 in address pointer 23 are used to point toward an address of the control command storage device 21, namely the first address, and an address of the data storage device 22, namely, the second address. The multi-level signal decoder 24 is used to decode the control command stored in an n-level data form and read from the first address of the control command storage device 21. After the data is decoded, a control signal representing the control command is delivered to the data processing unit 25. In practice, the multi-level signal decoder 24 is performed by using at least a voltage-level comparator. The data processing unit 25 is electrically connected to the multi-level signal decoder 24 and the data storage device 22 for processing the data stored in an m-level data form and read from the second address of the data storage device 22, thereby delivering an output signal. The functions of data processing and signal delivering are accordingly achieved.

Figure 3:
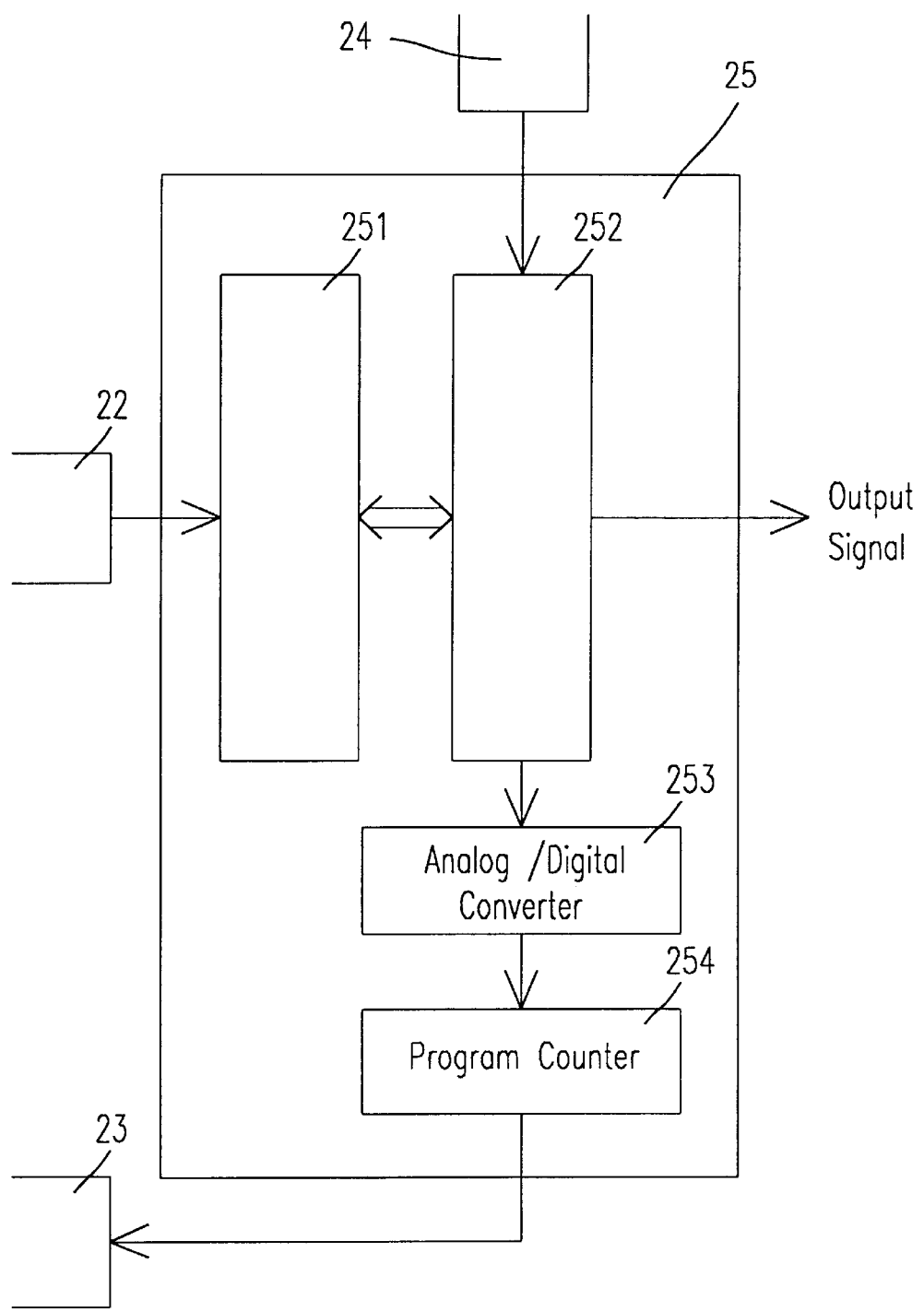
FIG. 3 is a schematic block diagram of a circuit of a data processing system illustrated in FIG. 2.

FIG. 3 is a schematic block diagram of a circuit of a data processing unit 25 according to a first preferred embodiment, which comprises a multi-level data register 251, a multi-level data processor 252, an analog-to-digital converter 253 and a program counter 254. The multi-level data register 251 is used to read the data to be processed in an m-level data form from the second address of the data storage device 22 stored, and then the processed data is stored in the multi-level data register 251. The multi-level data processor 252 is electrically connected to the multi-level data register 251 and the multi-level signal decoder 24 for processing data stored in the multi-level data register 251 in an m-level data form in response to the operational control commands, storing back into the multi-level data register 251 and delivering an analog address signal. The analog-to-digital converter 253 is used to convert the analog signal to a digital signal, and the digital signal is then delivered to a program counter 254. The program counter 254 delivers a counting signal to the address pointer 23 in response to the digital address signal and further controls the address pointer to point toward a corresponding address of the control command storage device 21 and the data storage device 22.

Figure 4A:
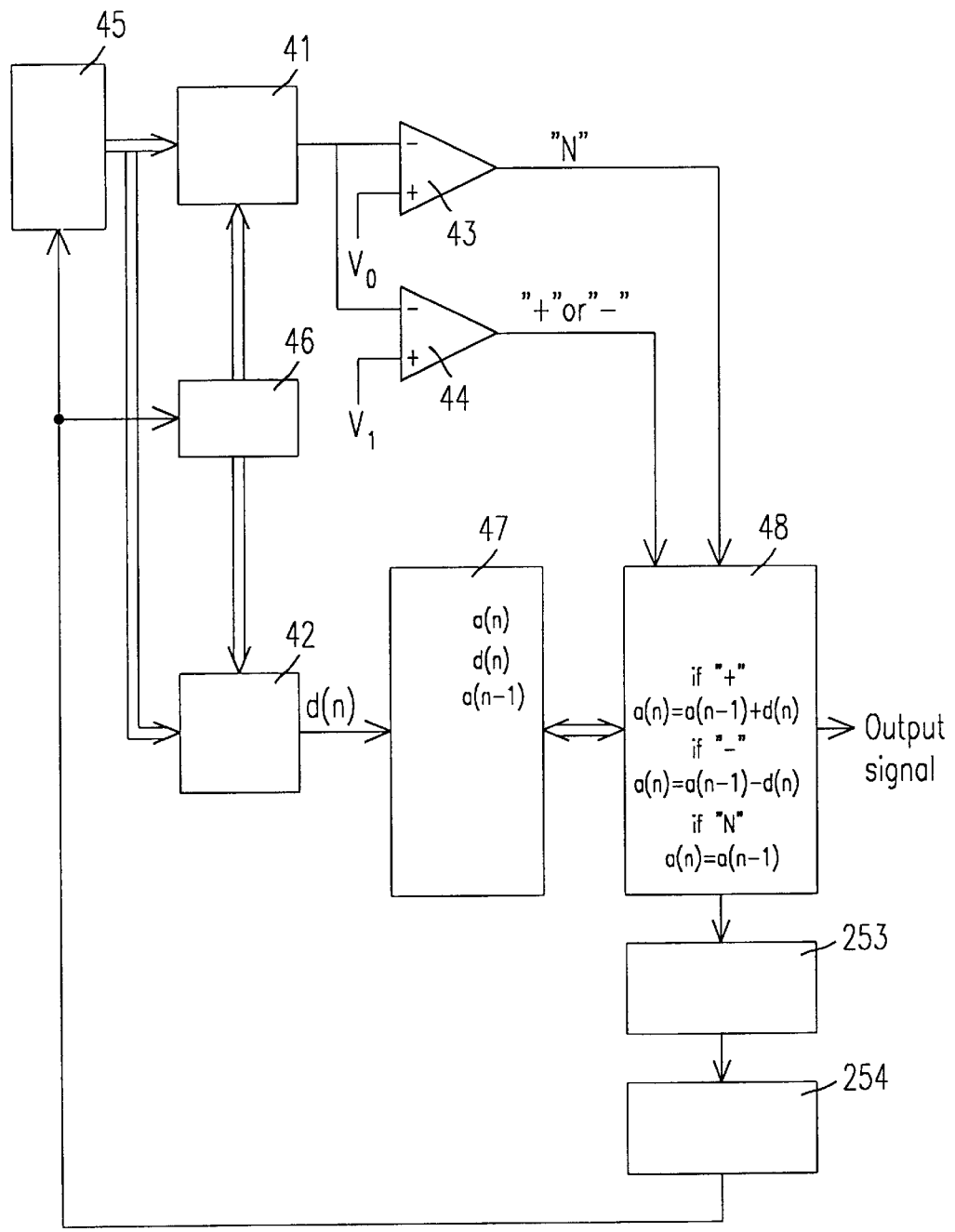
FIG. 4(a) is a function block diagram of the first exemplary circuit used in a DPCM signal synthetic processing device according to the first embodiment of the present invention.

The above embodiment will be further understood by employing a differential pulse code modulation (DPCM) signal synthetic processing device. FIG. 4(a) is a function block diagram of the first exemplary circuit used in a DPCM signal synthetic processing device according to the first embodiment of the present invention. In this example, the control command storage device is a tri-level memory cell for storing the operational control commands symbolically representing "N", "+" and "−" in small, medium and large voltage-level signal forms (e.g. 1V, 2V and 3V), respectively. In practice, two reference voltages V0 and V1 (e.g. 1.5 V and 2.5V) are applied in sequence to the memory cell and two comparators 43, 44 are used. The first voltage comparator 43 is electrically connected to the tri-level memory cell 41 and the first fixed reference voltage V0 (e.g. 1.5V). When the voltage-level signal read from the tri-level memory cell 41 is a small voltage-level signal (e.g. 1V) and smaller than the first fixed reference voltage V0, the comparator 43 delivers a high-level voltage signal (e.g. 5V) representing "N" operational control commands. On the contrary, when the voltage-level signal read from the tri-level memory cell 41 is greater than the first fixed reference voltage V0, the comparator 43 delivers a low-level voltage signal (e.g. 0V). At this situation, the second voltage comparator 44 is further used to determine the other operational control commands, i.e. "+" or "0". The second voltage comparator 44 is electrically connected to the tri-level memory cell 41 and a second fixed reference voltage V1 (e.g. 2.5V). When the voltage-level signal read from the tri-level memory cell 41 is a medium voltage-level signal (e.g. 2V) and smaller than the second fixed reference voltage V1, the comparator 44 delivers a high-level voltage signal (e.g. 5V) representing "+" operational control command. On the contrary, when the voltage-level signal read from the tri-level memory cell is a large voltage-level signal (e.g. 3V) and greater than the second fixed reference voltage V1, the voltage comparator 44 delivers a low-level voltage signal (e.g. 0V) representing "−" operational control commands. Furthermore, the m-level voltage signal d(n) stored in the data storage device 42 represents the amplitude difference of the output signal. If m=256, d(n) is one of the amplitude difference of the 256 output signals.

Tables 1 and 2 indicate the amplitude difference data stored in the data storage device 42 and the corresponding control command of the voltage-level signal stored in the tri-level memory cell 41, respectively.

TABLE 1

| address | 1 | 2 | 3 | 4 | 5 | ... | ... | ... | n |
|---|---|---|---|---|---|---|---|---|---|
| data | d(1) | d(2) | d(3) | d(4) | d(5) | ... | ... | ... | d(n) |

TABLE 2

| address | 1 | 2 | 3 | 4 | 5 | ... | ... | ... | n |
|---|---|---|---|---|---|---|---|---|---|
| command | + | + | − | N | + | ... | ... | ... | + |

The program counter 254 delivers a counting signal having a period of T to control the column address device 46 and the row address device 45 to point toward the corresponding addresses of the tri-level memory cell 41 and the data storage device 42. The operational control command shown in Table 2 is obtained by decoding the voltage-level signal stored in the tri-level memory cell 41 with the first comparator 43 and the second comparator 44, and thereby a control signal in response to the control command is delivered to the multi-level data processor 48. At the same time, the data stored in the data storage device 42 is read and stored to the multi-level data register 47. A operational process is conducted in the multi-level data processor 48 for processing the difference data d(n) and the previous data a(n−1) stored in the multi-level data register 47 according to the control signal. The result a(n) is delivered in an output signal form and a(n) is stored back to the multi-level data register 47 for replacing the previous data a(n−1).

Figure 4B:
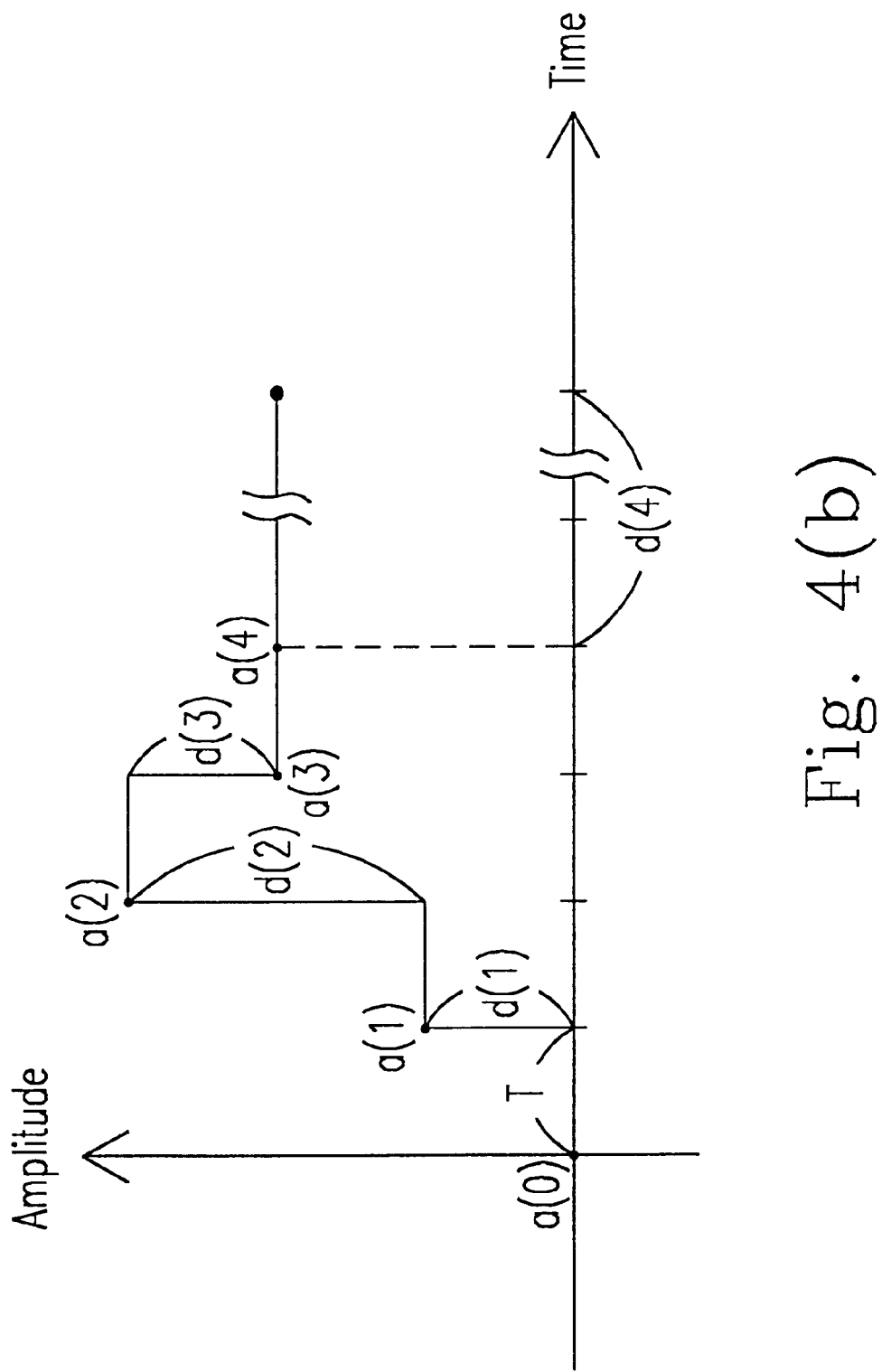
FIG. 4(b) is a timing diagram of the sound signal synthesis in the device illustrated in FIG. 4(a)

Please refer to Tables 1, 2 and FIGS. 4(a), 4(b). When the column address device 46 and the row address device 45 in sequence point toward the address 1 of the data storage device 42 and the tri-level memory cell 41, the difference data stored in the data storage device 42, i.e. d(1), is read and stored to the multi-level data register 47. The medium voltage-level signal (e.g. 2V) stored in the corresponding address of the tri-level memory cell 41 and representing "+" operational control command is decoded by the voltage comaparator 43 and/or 44. A control signal in response to the control command is delivered to the multi-level data processor 48. Then, an operational process is conducted in the multi-level data processor 48 for processing the difference data d(1) and the previous data a(0) stored in the multi-level data register 47 according to the control signal. Provided that the initial value a(0)=0, a(1)=a(0)+d(1)=0+d(1)=d(1). The result data a(1) is delivered in an output signal form and stored back to the multi-level data register 47 for replacing the previous data a(0). Similarly, when the next clock is triggered, the column address device 46 and the row address device 45 in sequence point toward the address 2 of the data storage device 42 and the tri-level memory cell 41. The difference data stored in the data storage device 42, i.e. d(2), is read and stored to the multi-level data register 47. Then, an operational process is conducted in the multi-level data processor 48 for processing the difference data d(2) and the previous data a(1) stored in the multi-level data register 47 according to the "+" operational control command, thereby having a(2)=a(1)+d(2)=d(1)+d(2). The result a(2) is delivered in an output signal form and stored back to the multi-level data register 47 for replacing the previous data a(1). Similarly, when the next clock is triggered, the column address device 46 and the row address device 45 in sequence point to the address 3 of the data storage device 42 and the tri-level memory cell 41. The difference data stored in the data storage device 42, i.e. d(3), is read and stored to the multi-level data register 47. Then, an operational process is conducted in the multi-level data processor 48 for processing the difference data d(3) and the previous data a(2) stored in the multi-level data register 47 according to the "−" operational control command, thereby having a(3)=a(2)−d(3)=d(1)+d(2)−d(3). The result a(3) is delivered in an output signal form and stored back to the multi-level data register 47 for replacing the previous data a(2). Similarly, when the next clock is triggered, the column address device 46 and the row address device 45 in sequence point to the address 4 of the data storage device 42 and the tri-level memory cell 41. The difference data stored in the data storage device 42, i.e. d(4), is read and stored to the multi-level data register 47. Then, an operational process is conducted in the multi-level data processor 48 for processing the difference data d(4) and the previous data a(3) stored in the multi-level data register 47 according to the "N" operational control command, thereby having a(4)=a(3)=d(1)+d(2)–d(3). The result a(4) is delivered in an output signal form and stored back to the multi-level data register 47 for replacing the previous data a(3) and delivering an analog signal. The analog signal is converted to a digital signal via the analog-to-digital converter 253 and the digital signal is then delivered to the program counter 254. The program counter 254 will stop counting for d(4) number of clock periods, i.e. the amplitude d(1)+d(2)–d(3) will continue for 50 T if d(4)=50. The rest may be deduced by analogy that the synthesis of the output signals can be conducted by continuing the above data processing method as the clock signals proceed. Accordingly, the sound signals are emitted as can be seen in FIG. 4(b).

Figure 5A:
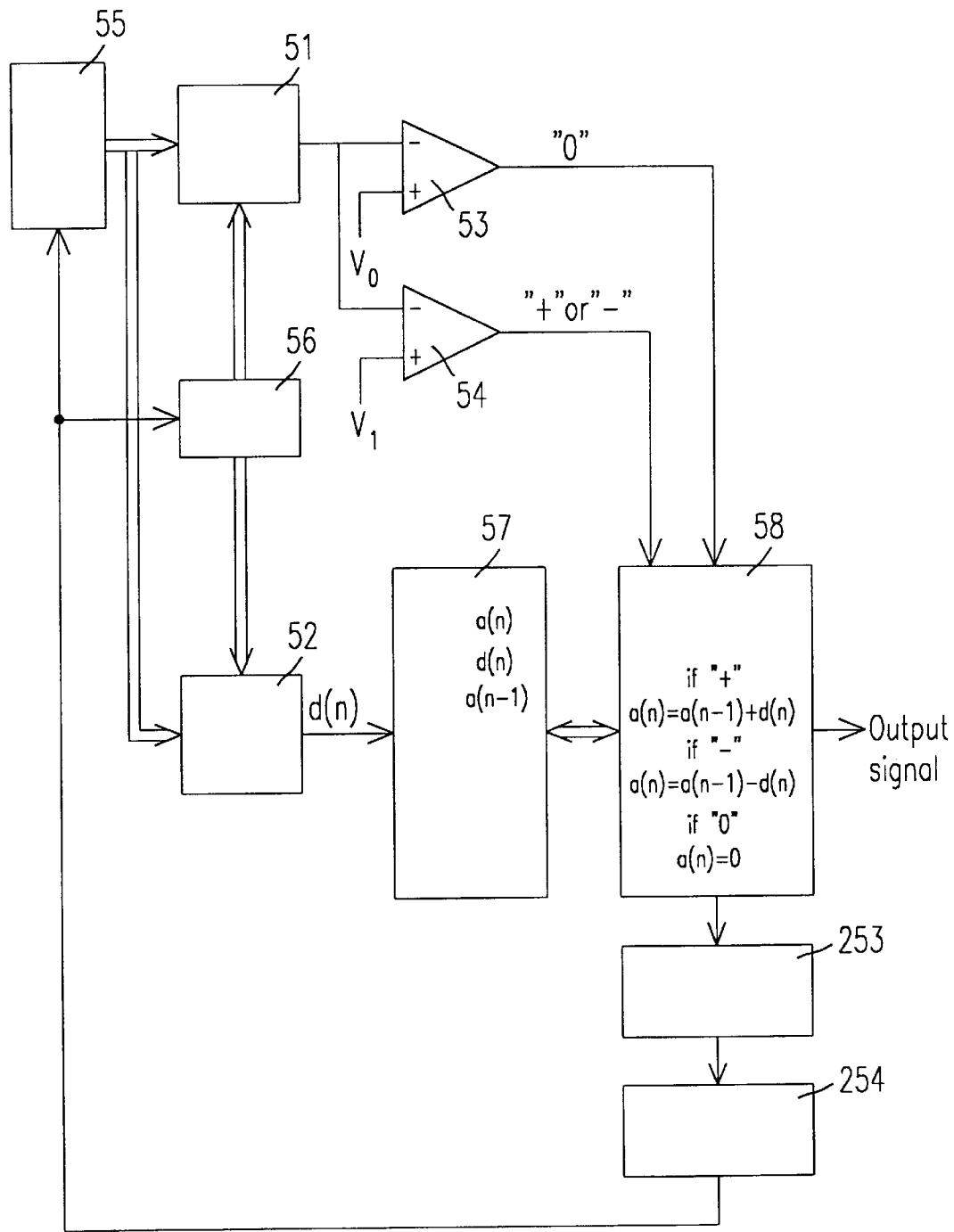
FIG. 5(a) is a function block diagram of the second circuit used in a DPCM signal synthetic processing device according to the first embodiment of the present invention.

FIG. 5(a) is a function block diagram of the second exemplary circuit used in a DPCM signal synthetic processing device according to the first embodiment of the present invention. In this example, the control command storage device is a tri-level memory cell 51 for storing the operational control commands symbolically representing "0", "+" and "–" in small, medium and large voltage-level signal forms (e.g. 1V, 2V and 3V), respectively. In practice, two reference voltages V0 and V1 (e.g. 1.5 V and 2.5V) are applied in sequence to the memory cell and two comparators 53, 54 are used. The first voltage comparator 53 is electrically connected to the tri-level memory cell 51 and the first fixed reference voltage V0 (e.g. 1.5V). When the voltage-level signal read from the tri-level memory cell 51 is a small voltage-level signal (e.g. 1V) and smaller than the first fixed reference voltage V0, the comparator 53 delivers a high-level voltage signal (e.g. 5V) representing "0" operational control commands. On the contrary, when the voltage-level signal read from the tri-level memory cell 51 is greater than the first fixed reference voltage V0, the comparator 53 delivers a low-level voltage signal (e.g. 0V). At this situation, the second voltage comparator 54 is further used to determine the other operational control commands, i.e. "+" or "–". The second voltage comparator 54 is electrically connected to the tri-level memory cell 41 and a second fixed reference voltage V1 (e.g. 2.5V). When the voltage-level signal read from the tri-level memory cell 51 is a medium voltage-level signal (e.g. 2V) and smaller than the second fixed reference voltage V1, the comparator 54 delivers a high-level voltage signal (e.g. 5V) representing "+" operational control command. On the contrary, when the voltage-level signal read from the tri-level memory cell is a large voltage-level signal (e.g. 3V) and greater than the second fixed reference voltage V1, the comparator delivers a low-level voltage signal (e.g. 0V) representing "–" operational control commands. Furthermore, the m-level voltage signal d(n) stored in the data storage device 52 represents the amplitude difference of the output signal. If m=256, d(n) is one of the amplitude difference of the 256 output signals.

Tables 3 and 4 indicate the amplitude difference data stored in the data storage device 52 and the corresponding control command of the voltage-level signal stored in the tri-level memory cell 51, respectively.

TABLE 3

| Address | 1 | 2 | 3 | 4 | 5 | ... | ... | ... | n |
|---|---|---|---|---|---|---|---|---|---|
| Data | d(1) | d(2) | d(3) | d(4) | d(5) | ... | ... | ... | d(n) |

TABLE 4

| Address | 1 | 2 | 3 | 4 | 5 | ... | ... | ... | n |
|---|---|---|---|---|---|---|---|---|---|
| Command | + | + | – | 0 | + | ... | ... | ... | + |

The program counter 254 delivers a counting signal having a period of T to control the column address device 56 and the row address device 55 to point toward the corresponding addresses of the tri-level memory cell 51 and the data storage device 52. The operational control command shown in Table 4 is obtained by decoding the voltage-level signal stored in the tri-level memory cell 51 with the first comparator 53 and the second comparator 54, and thereby a control signal in response to the control command is delivered to the multi-level data processor 58. At the same time, the data stored in the data storage device 52 is read and stored to the multi-level data register 57. An operational process is conducted in the multi-level data processor 58 for processing the difference data d(n) and the previous data a(n–1) stored in the multi-level data register 57 according to the control signal. The result a(n) is delivered in an output signal form and a(n) is stored back to the multi-level data register 57 for replacing the previous data a(n–1).

Figure 5B:
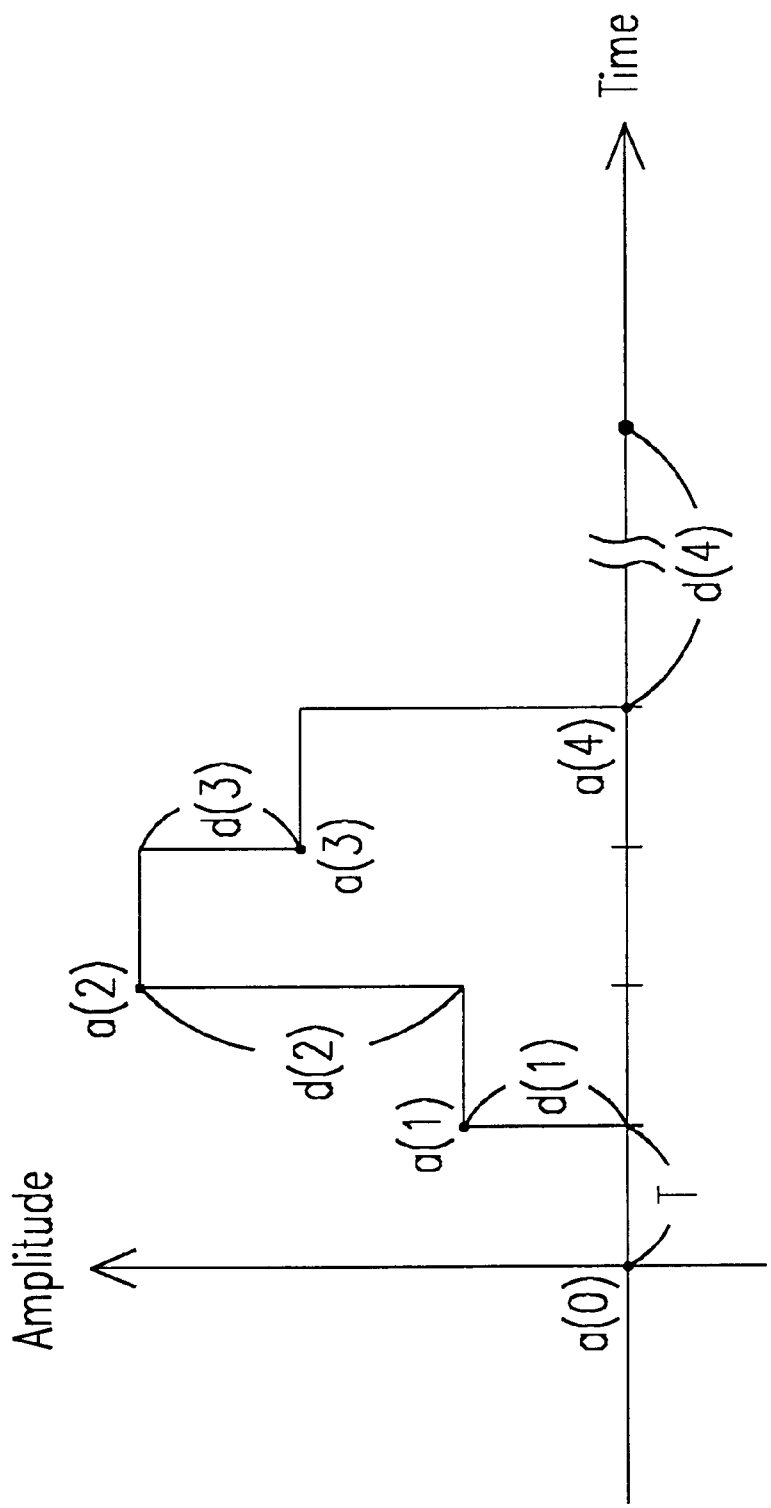
FIG. 5(b) is a timing diagram of sound signal synthesis in the device illustrated in FIG. 5(a)

Please refer to Tables 3, 4 and FIGS. 5(a), 5(b). When the column address device 56 and the row address device 55 in sequence point toward the address 1 of the data storage device 52 and the tri-level memory cell 51, the difference data stored in the data storage device 52, i.e. d(1), is read and stored to the multi-level data register 57. The medium voltage-level signal (e.g. 2V) stored in the corresponding address of the tri-level memory cell 51 and representing "+" operational control command is decoded by the voltage comaparator 53 and/or 54, and thereby a control signal in response to the control command is delivered to the multi-level data processor 58. An operational process is conducted in the multi-level data processor 58 for processing the difference data d(1) and the previous data a(0) stored in the multi-level data register 57 according to the control signal. Provided that the initial value a(0)=0, a(1)=a(0)+d(1)=0+d(1)=d(1). The result data a(1) is delivered in an output signal form and stored back to the multi-level data register 57 for replacing the previous data a(0). Similarly, when the next clock is triggered, the column address device 56 and the row address device 55 in sequence point to the address 2 of the data storage device 52 and the tri-level memory cell 41. The difference data stored in the data storage device 52, i.e. d(2), is read and stored to the multi-level data register 57. Then, an operational process is conducted in the multi-level data processor 58 for processing the difference data d(2) and the previous data a(1) stored in the multi-level data register 57 according to the "+" operational control command, thereby having a(2)=a(1)+d(2)=d(1)+d(2). The result a(2) is delivered in an output signal form and stored back to the multi-level data register 57 for replacing the previous data a(1). Similarly, when the next clock is triggered, the column address device 56 and the row address device 55 in sequence point toward the address 3 of the data storage device 52 and the tri-level memory cell 41. The difference data stored in the data storage device 52, i.e. d(3), is read and stored to the multi-level data register 57. Then, an operational process is conducted in the multi-level data processor 48 for processing the difference data d(3) and the previous data a(2) stored in the multi-level data register 57 according to the "–" operational control command, thereby having a(3)=a(2)–d(3)=d(1)+d(2)–d(3). The result a(3) is delivered in an output signal form and stored back to the multi-level data register 57 for replacing the previous data a(2). Similarly, when the next clock is triggered, the column address device 56 and the row address device 55 in sequence point toward the address 4 of the data storage device 52 and the tri-level memory cell 51. The difference data stored in the data storage device 52, i.e. d(4), is read and stored to the multi-level data register 57. Then, an operational process is conducted in the multi-level data processor 58 for processing the difference data d(4) and the previous data a(3) stored in the multi-level data register 47 according to the "0" operational control command, thereby a(4)=0. The result a(4) is delivered in an output signal form and stored back to the multi-level data register 57 for replacing the previous data a(3) and delivering an analog signal. The analog signal is converted to a digital signal via the analog-to-digital converter 253 and the digital signal is then delivered to the program counter 254. The program counter 254 will stop counting for d(4) number of clock periods, i.e. the amplitude 0 will continue for 50 T if d(4)=50. The rest may be deduced by analogy that the synthesis of the output signals can be conducted by continuing the above data processing method as the clock signals proceed. Accordingly, the sound signals are emitted as can be seen in FIG. 5(b).

Figure 6A:
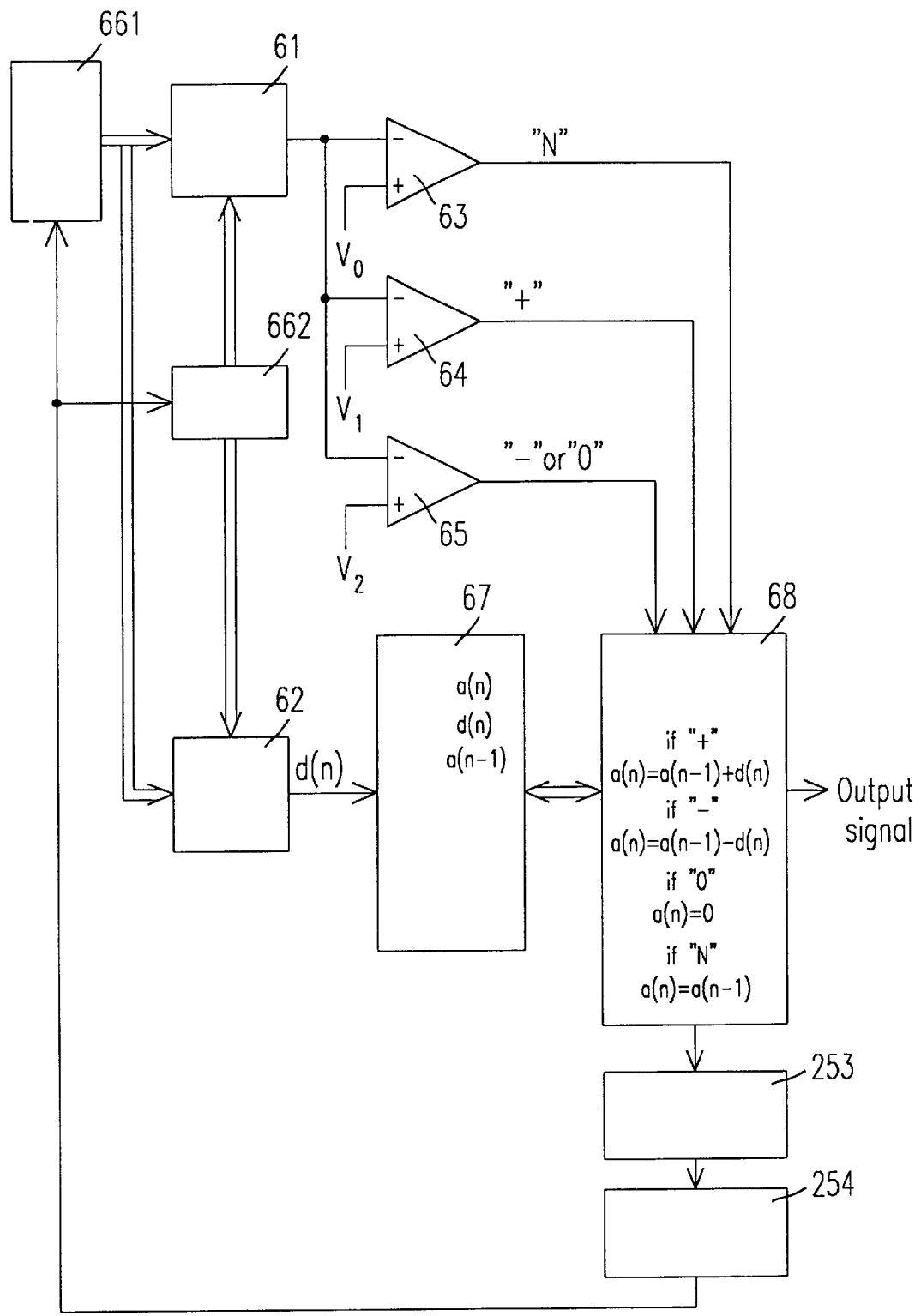
FIG. 6(a) is a function block diagram of the third circuit used in a DPCM signal synthetic processing device according to the first embodiment of the present invention.

FIG. 6(a) is a function block diagram of the third exemplary circuit used in a DPCM signal synthetic processing device according to the first embodiment of the present invention. In this example, the control command storage device is a quartet-level memory cell 61 for storing the operational control commands symbolically representing "N", "+", "−" and "0" in four voltage-level signal forms (e.g. 1V, 2V, 3V and 4V), respectively. In practice, three reference voltages V0 (e.g. 1.5 V), V1 (e.g. 2.5V) and V2 (e.g. 3.5V) are applied in sequence to the memory cell and three comparators (63, 64 and 65) are used. The first voltage comparator 63 is electrically connected to the quartet-level memory cell 61 and the first fixed reference voltage V0 (e.g. 1.5V). When the voltage-level signal, e.g. 1V, read from the quartet-level memory cell 61 is smaller than the first fixed reference voltage V0, the comparator 63 delivers a high-level voltage signal (e.g. 5V) representing "N" operational control command. On the contrary, when the voltage-level signal read from the quartet-level memory cell 61 is greater than the first fixed reference voltage V0, the comparator 63 delivers a low-level voltage signal (e.g. 0V). At this situation, the comparator 64 and/or comparator 65 is further used to determine which operation of the rest ("+", "−" or "0") is executed. The second voltage comparator 64 is electrically connected to the quartet-level memory cell 61 and a second fixed reference voltage V1 (e.g. 2.5V). When the voltage-level signal, e.g. 2V, read from the quartet-level memory cell 61 is smaller than the second fixed reference voltage V1, the comparator 64 delivers a high-level voltage signal (e.g. 5V) representing "+" operational control command. On the contrary, when the voltage-level signal read from the quartet-level memory cell 61 is greater than the second fixed reference voltage V1, the comparator 64 delivers a low-level voltage signal (e.g. 0V). At this situation, the comparator 65 is further used to determine which operation of the rest ("−" or "0") is executed. The third voltage comparator 65 is electrically connected to the quartet-level memory cell 61 and a third fixed reference voltage V2 (e.g. 3.5V). When the voltage-level signal, e.g. 3V, read from the quartet-level memory cell 61 is smaller than the third fixed reference voltage V2, the comparator 65 delivers a high-level voltage signal (e.g. 5V) representing "−" operational control commands. On the contrary, when the voltage-level signal, e.g. 4V, read from the quartet-level memory cell 61 is greater than the third fixed reference voltage V2, the comparator 65 delivers a low-level voltage signal (e.g. 0V) representing "0" operational control commands. Furthermore, the m-level voltage signal d(n) stored in the data storage device 62 represents the amplitude difference of the output signal. If m=256, d(n) is one of the amplitude difference of the 256 output signals.

Tables 5 and 6 indicate the amplitude difference data stored in the data storage device 62 and the corresponding control command of the voltage-level signal stored in the quartet-level memory cell 61, respectively.

TABLE 5

| Address | 1 | 2 | 3 | 4 | 5 | ... | ... | ... | n |
|---|---|---|---|---|---|---|---|---|---|
| Data | d(1) | d(2) | d(3) | d(4) | d(5) | ... | ... | ... | d(n) |

TABLE 6

| Address | 1 | 2 | 3 | 4 | 5 | ... | ... | ... | n |
|---|---|---|---|---|---|---|---|---|---|
| Command | + | − | 0 | + | N | ... | ... | ... | + |

The program counter 254 delivers a counting signal having a period of T to control the column address device 662 and the row address device 661 to point toward the corresponding addresses of the quartet-level memory cell 61 and the data storage device 62. The operational control command shown in Table 6 is obtained by decoding the voltage-level signal stored in the tri-level memory cell 61 with the first comparator 63, the second comparator 64 and the third comparator 65, and thereby a control signal in response to the control command is delivered to the multi-level data processor 68. At the same time, the data stored in the data storage device 62 is read and stored to the multi-level data register 67. An operational process is conducted in the multi-level data processor 68 for processing the difference data d(n) and the previous data a(n−1) stored in the multi-level data register 67 according to the control signal. The result a(n) is delivered in an output signal form and a(n) is stored back to the multi-level data register 67 for replacing the previous data a(n−1).

Figure 6B:
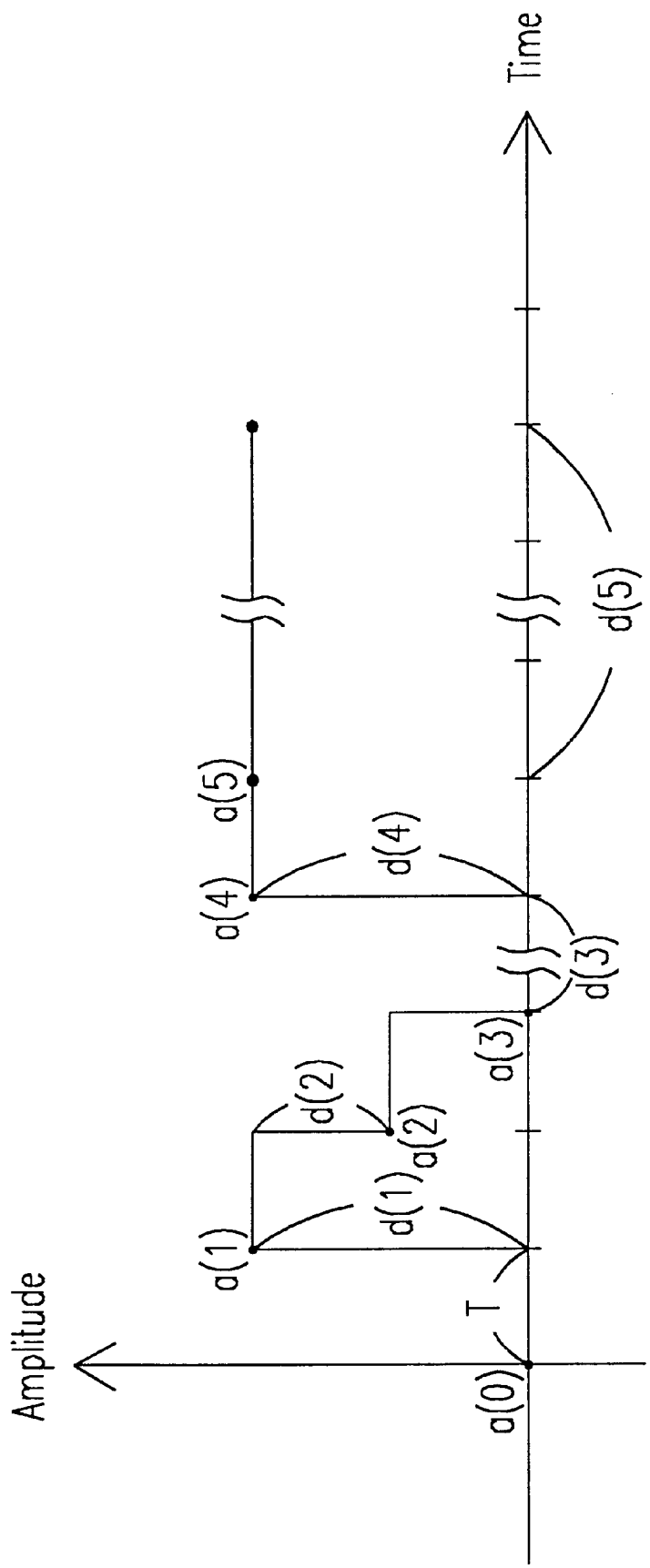
FIG. 6(b) is a timing diagram of sound signal synthesis in the device illustrated in FIG. 6(a)

Please refer to Tables 5, 6 and FIGS. 6(a), 6(b). When the column address device 662 and the row address device 661 in sequence point toward the address 1 of the data storage device 62 and the quartet-level memory cell 61, the difference data stored in the data storage device 62, i.e. d(1), is read and stored to the multi-level data register 67. The voltage-level signal (e.g. 2V) stored in the corresponding address of the quartet-level memory cell 61 and representing "+" operational control command is decoded by the voltage comaparators 63, 64 and/or 65, and thereby a control signal in response to the control command is delivered to the multi-level data processor 68. An operational process is conducted in the multi-level data processor 68 for processing the difference data d(1) and the previous data a(0) stored in the multi-level data register 67 according to the control signal. Provided that the initial value a(0)=0, a(1)=a(0)+d(1)=0+d(1)=d(1). The result data a(1) is delivered in an output signal form and stored back to the multi-level data register 67 for replacing the previous data a(0). Similarly, when the next clock is triggered, the column address device 662 and the row address device 661 point toward the address 2 of the data storage device 62 and the quartet-level memory cell 61. The difference data stored in the data storage device 52, i.e. d(2), is read and stored to the multi-level data register 67. Then, an operational process is conducted in the multi-level data processor 68 for processing the difference data d(2) and the previous data a(1) stored in the multi-level data register 67 according to the "−" operational control command, thereby having a(2)=a(1)−d(2)=d(1)−d(2). The result a(2) is delivered in an output signal form and stored back to the multi-level data register 67 for replacing the previous data a(1). Similarly, when the next clock is triggered, the column address device 662 and the row address device 661 in sequence point toward the address 3 of the data storage device 62 and the quartet-level memory cell 61. The difference data stored in the data storage device 62, i.e. d(3), is read and stored to the multi-level data register 67. A operational process is conducted in the multi-level data processor 68 for processing the difference data d(3) and the previous data a(2) stored in the multi-level data register 67 according to the "0" operational control command, thereby having a(3)=0. The result a(3) is delivered in an output signal form and stored back to the multi-level data register 67 for replacing the previous data a(2) and delivering an analog signal. The analog signal is converted to a digital signal via the analog-to-digital converter 253 and the digital signal is then delivered to the program counter 254. The program counter 254 will stop counting for d(3) number of clock periods, i.e. the amplitude 0 will continue for 20 T if d(3)=20. When the column address device 662 and the row address device 661 in sequence point toward the address 4 of the data storage device 62 and the quartet-level memory cell 61, the difference data stored in the data storage device 62, i.e. d(4), is read and stored to the multi-level data register 67. An operational process is conducted in the multi-level data processor 68 for processing the difference data d(4) and the previous data a(3) stored in the multi-level data register 67 according to the "+" operational control command, thereby having a(4)=a(3)+d(4)=0+d(4)=d(4). When the column address device 662 and the row address device 661 in sequence point toward the address 5 of the data storage device 62 and the quartet-level memory cell 61, the difference data stored in the data storage device 62, i.e. d(5), is read and stored to the multi-level data register 67. Then, an operational process is conducted in the multi-level data processor 68 for processing the difference data d(5) and the previous data a(4) stored in the multi-level data register 67 according to the "N" operational control command, thereby having a(5)=a(4)=d(4). The result a(5) is delivered in an output signal form and stored back to the multi-level data register 67 for replacing the previous data a(4) and delivering an analog signal. The analog signal is converted to a digital signal via the analog-to-digital converter 253 and the digital signal is then delivered to the program counter 254. The program counter 254 will stop counting for d(5) number of clock periods, i.e. the amplitude d(4) will continue for 50 T if d(5)=50. The rest may be deduced by analogy that the synthesis of the output signals can be conducted by continuing the above data processing method as the clock signals proceed. Accordingly, the sound signals are emitted as can be seen in FIG. 6(b).

Figure 7:
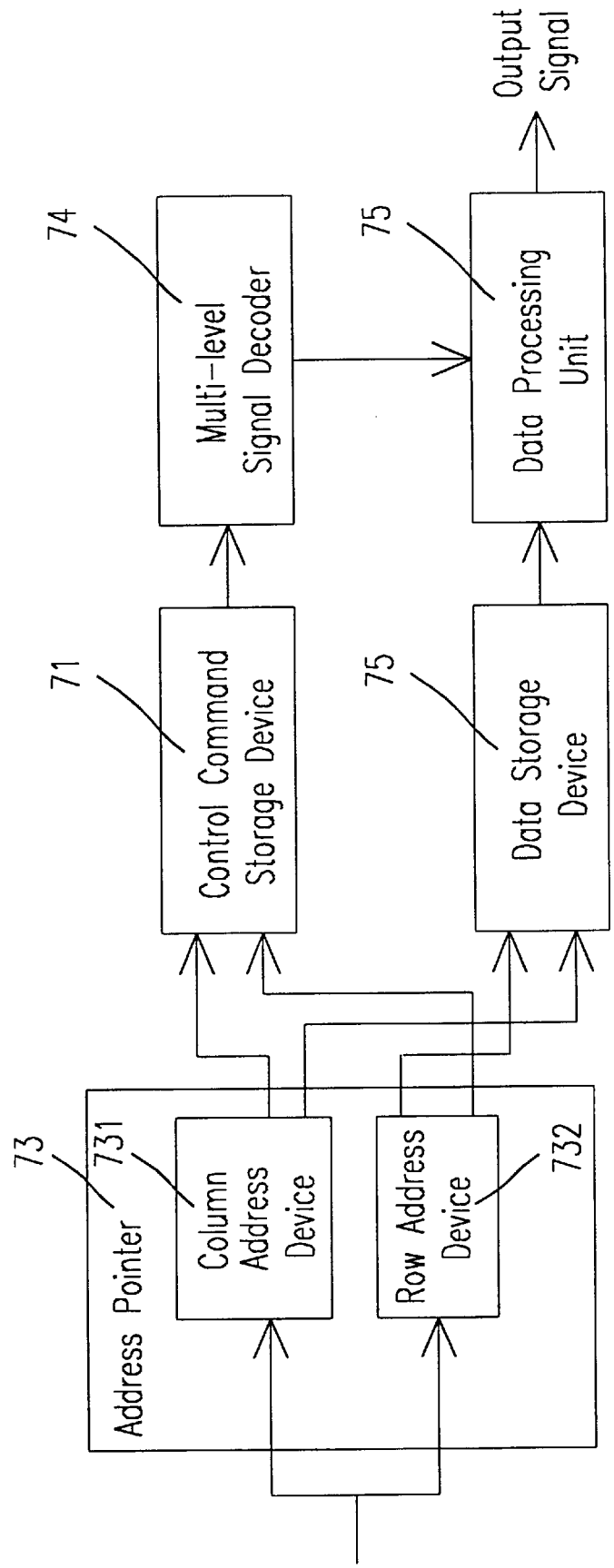
FIG. 7 is a function block diagram of a circuit of a data processing system according to the second embodiment of the present invention.
Figure 8:
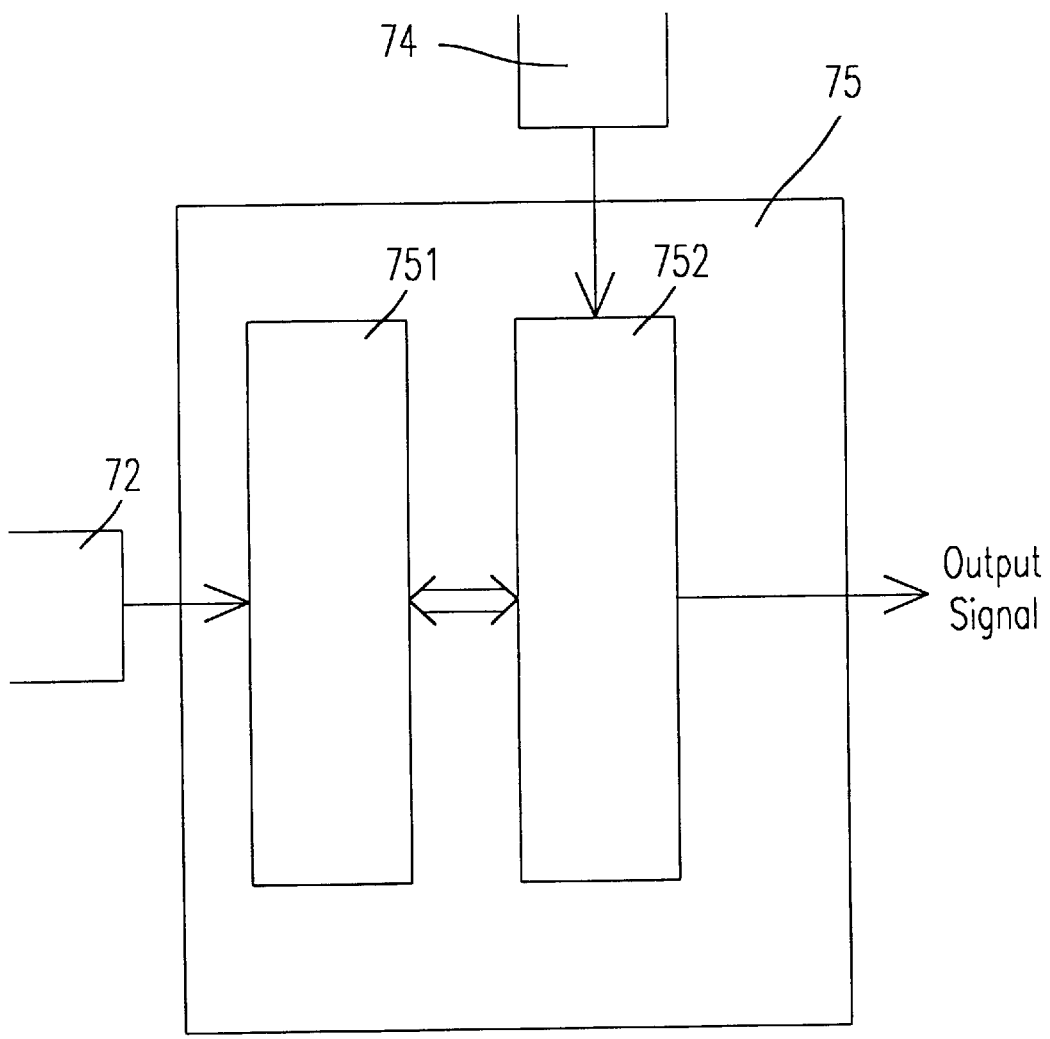
FIG. 8 is a schematic block diagram of a circuit of a data processing system illustrated in FIG. 7.

As described above in accordance with the present invention, it will be apparent that the more level the data stored in the control command storage device is, the higher compressive ratio data to be processed will have. However, the circuit will be more complicated due to more voltage comparators needed. In order to simplify the circuit, a second preferred embodiment is developed, as can be seen in FIG. 7. FIG. 7 is a function block diagram of a circuit of a data processing unit according to the second embodiment of the present invention. The data processing system shown in FIG. 7 comprises a control command storage device 71, a data storage device 72, an address pointer 73 comprising a column address device 731 and a row address device 732, a digital signal decoder 74 and a data processing unit 75. The data processing system shown in FIG. 7 is the same as that described in the first embodiment, except that the control command storage device 71 is a typical digital memory cell, for example a dynamic random access memory (DRAM), and the multi-level signal decoder 24 is replaced by a digital signal decoder 74. FIG. 8 is a schematic block diagram of a circuit of a data processing unit 75 according to the second preferred embodiment of the present invention. The data processing unit 75 comprises a multi-level data register 751 and a multi-level data processor 752. The multi-level data register 751 is used to read and store the data to be processed from the second address of the data storage device 72 stored in an m-level data form. The multi-level data processor 752 is electrically connected to the multi-level data register 751 and the digital signal decoder 74 for processing data stored in the multi-level data register 751 in an m-level data form in response to the operational control commands, storing back into the multi-level data register 751 and delivering an output signal.

Figure 9A:
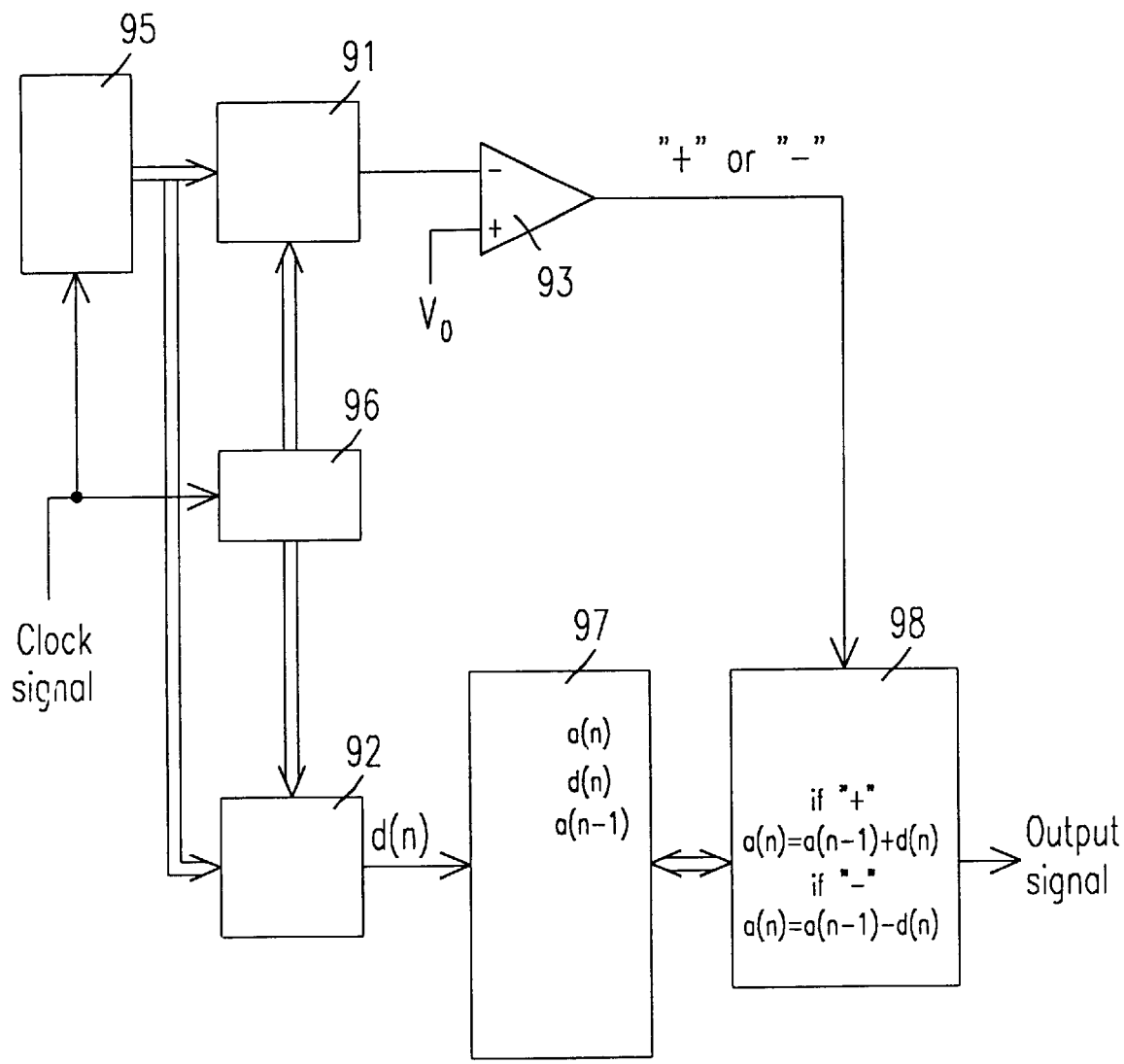
FIG. 9(a) is a function block diagram of an exemplary circuit used in a DPCM signal synthetic processing device according to the second embodiment of the present invention.

FIG. 9(a) is a function block diagram of the circuit used in a DPCM signal synthetic processing device according to the second embodiment of the present invention. In this example, the digital memory cell 91 is used to store two operational control commands symbolically representing "+" and "−" in small and large voltage-level signal forms (e.g. 0V and 5V), respectively. In practice, a reference voltage V0 is applied and a comparator 93 is used. The comparator 93 is electrically connected to the digital memory cell 91 and the first fixed reference voltage V0 (e.g. 2.5V). When the voltage-level signal, e.g. 0 V, read from the digital memory cell 91 is smaller than the first fixed reference voltage V0, the comparator 93 delivers a high-level voltage signal (e.g. 5V) representing "+" operational control commands. On the contrary, when the voltage-level signal, e.g. 5V, read from the digital memory cell 91 is greater than the first fixed reference voltage V0, the comparator 93 delivers a low-level voltage signal (e.g. 0V) representing "−" operational control command. Furthermore, the m-level voltage signal d(n) stored in the data storage device 92 represents the amplitude difference of the output signal. If m=256, d(n) is one of the amplitude difference of the 256 output signals.

Tables 7 and 8 indicate the amplitude difference data stored in the data storage device 92 and the corresponding control command of the voltage-level signal stored in the digital memory cell 91, respectively.

TABLE 7

| Address | 1 | 2 | 3 | 4 | 5 | ... | ... | ... | n |
|---|---|---|---|---|---|---|---|---|---|
| Data | d(1) | d(2) | d(3) | d(4) | d(5) | ... | ... | ... | d(n) |

TABLE 8

| Address | 1 | 2 | 3 | 4 | 5 | ... | ... | ... | n |
|---|---|---|---|---|---|---|---|---|---|
| Command | + | + | − | − | + | ... | ... | ... | + |

When the clock is triggered by the clock signal having a period T, the column address device 96 and row address device 95 in sequence point toward the corresponding addresses of the digital memory cell 91 and the data storage device 92. The operational control command shown in Table 8 is obtained by decoding the voltage-level signal stored in the address of the digital memory cell 91 with the comparator 93, and thereby a control signal in response to the control command is delivered to the multi-level data processor 98. At the same time, the data stored in the data storage device 92 is read and stored to the multi-level data register 97. An operational process is conducted in the multi-level data processor 98 for processing the difference data d(n) and the previous data a(n−1) stored in the multi-level data register 97 according to the control signal. The result a(n) is delivered in an output signal form and a(n) is stored back to the multi-level data register 97 for replacing the previous data a(n−1).

Figure 9B:
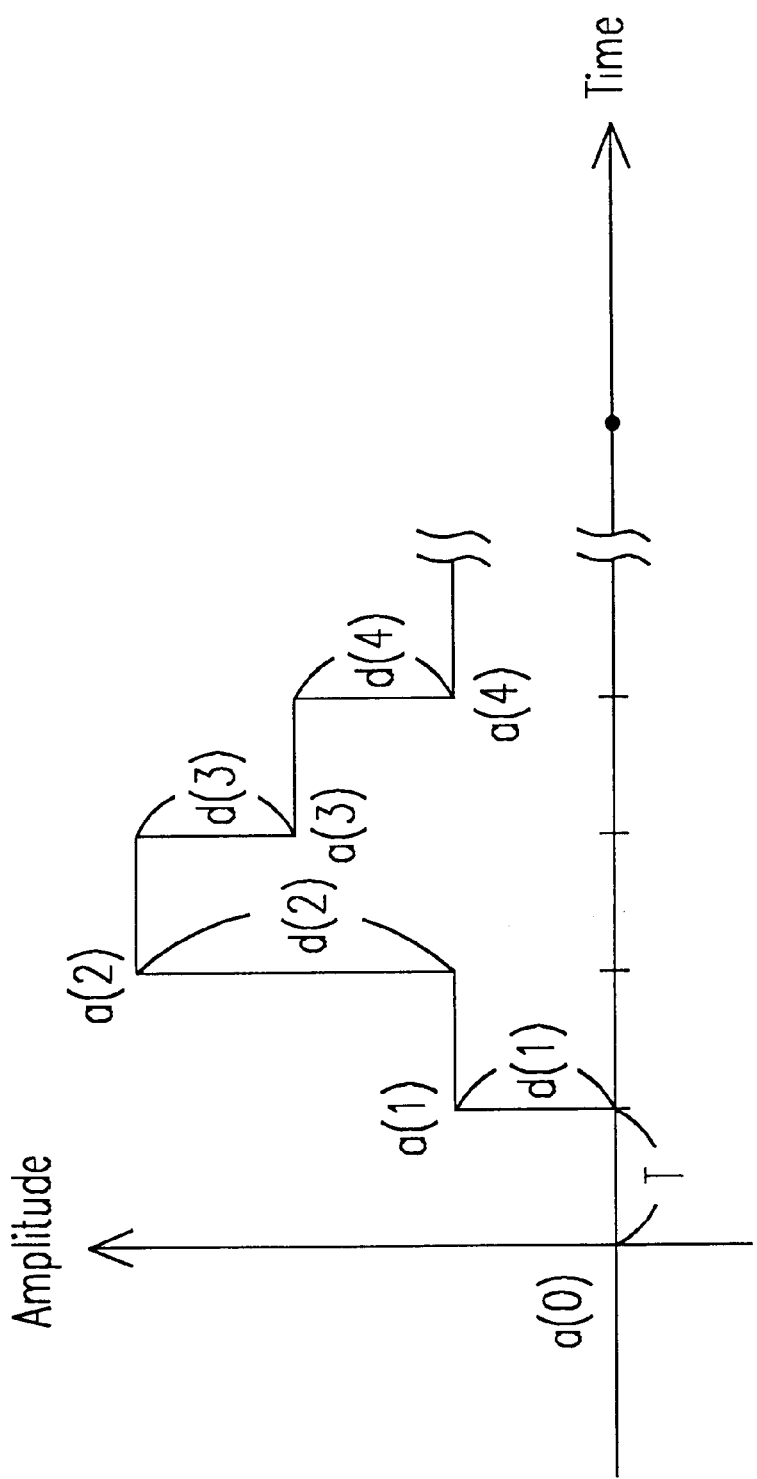
FIG. 9(b) is a timing diagram of sound signal synthesis in the device illustrated in FIG. 9(a).

Please refer to Tables 7, 8 and FIGS. 9(a), 9(b). When the column address device 96 and the row address device 95 in sequence point toward the address 1 of the data storage device 92 and the digital memory cell 91, the difference data stored in the data storage device 92, i.e. d(1), is read and stored to the multi-level data register 97. The high voltage-level signal (e.g. 5V) stored in the corresponding address of the digital memory cell 91 and representing "+" operational control command is decoded by the voltage comaparator 93, and thereby a control signal in response to the control command is delivered to the multi-level data processor 98. A operational process is conducted in the multi-level data processor 98 for processing the difference data d(1) and the previous data a(0) stored in the multi-level data register 97 according to the control signal. Provided that the initial value a(0)=0, a(1)=a(0)+d(1)=0+d(1)=d(1). The result data a(1) is delivered in an output signal form and stored back to the multi-level data register 97 for replacing the previous data a(0). Similarly, when the next clock is triggered, the column address device 96 and the row address device 95 in sequence point toward the address 2 of the data storage device 92 and the digital memory cell 91. The difference data stored in the data storage device 92, i.e. d(2), is read and stored to the multi-level data register 97. Then, an operational process is conducted in the multi-level data processor 98 for processing the difference data d(2) and the previous data a(1) stored in the multi-level data register 97 according to the "+" operational control command, thereby having a(2)=a(1)+d(2)=d(1)+d(2). The result a(2) is delivered in an output signal form and stored back to the multi-level data register 97 for replacing the previous data a(1). Similarly, when the next clock is triggered, the column address device 96 and the row address device 95 in sequence point toward the address 3 of the data storage device 92 and the digital memory cell 91. The difference data stored in the data storage device 92, i.e. d(3), is read and stored to the multi-level data register 97. Then, an operational process is conducted in the multi-level data processor 98 for processing the difference data d(3) and the previous data a(2) stored in the multi-level data register 97 according to the "−" operational control command, thereby having a(3)=a(2)−d(3)=d(1)+d(2)−d(3). The result a(3) is delivered in an output signal form and stored back to the multi-level data register 97 for replacing the previous data a(2). Similarly, when the next clock is triggered, the column address device 96 and the row address device 95 in sequence point toward the address 4 of the data storage device 92 and the digital memory cell 91. The difference data stored in the data storage device 92, i.e. d(4), is read and stored to the multi-level data register 97. Then, an operational process is conducted in the multi-level data processor 98 for processing the difference data d(4) and the previous data a(3) stored in the multi-level data register 97 according to the "−" operational control command, thereby having a(4)=a(3)−d(4)=d(1)+d(2)−d(3)−d(4). The result a(4) is delivered in an output signal form and stored back to the multi-level data register 97 for replacing the previous data a(3). When the next clock is triggered, the column address device 96 and the row address device 95 in sequence point to the address 5 of the data storage device 92 and the digital memory cell 91. The difference data stored in the data storage device 92, i.e. d(5), is read and stored to the multi-level data register 97. Then, an operational process is conducted in the multi-level data processor 98 for processing the difference data d(5) and the previous data a(4) stored in the multi-level data register 97 according to the "+" operational control command, thereby having a(5)=a(4)+d(5)=d(1)+d(2)−d(3)−d(4)+d(5). The result a(5) is delivered in an output signal form and stored back to the multi-level data register 97 for replacing the previous data a(4). The rest may be deduced by analogy that the synthesis of the output signals can be conducted by continuing the above data processing method as the clock signals proceed. Accordingly, the sound signals are emitted as can be seen in FIG. 9(b).

Because there are only two operational control commands used in the second embodiment of the present invention, the amount of comparator is reduced and the analog-to-digital converter 253 and the program counter 254 can be omitted. The data processing unit described in the second embodiment of the present invention will meet the requirement for processing a small amount of data.

While the foregoing has been described in terms of preferred embodiments of the invention, it will be appreciated by those skilled in the art that many variations and modifications may be made without departing from the principles and spirit of the invention, the scope of which is defined by the appended claims.

What is claimed is:

1. A data processing system comprising:
    a control command storage device which is a first multi-level memory cell for storing control commands in an n-level data form, wherein said n is an integer and at least 2;
    a data storage device which is a second multi-level memory cell for storing data in an m-level data form, wherein said m is an integer and greater than 2;
    an address pointer electrically connected to said control command storage device and said data storage device for pointing toward a first address of said control command storage device and a second address of said data storage device;
    a multi-level signal decoder electrically connected to said control command storage device for decoding said control command stored in said n-level data form and read from a first address of said control command storage device, thereby delivering a control signal representing said control command; and
    a data processing unit electrically connected to said multi-level signal decoder and said data storage device for processing said data stored in said m-level data form and read from said second address of said data storage device, thereby delivering an output signal.

2. The data processing system of claim 1, wherein said address pointer includes a column address device and a row address device.

3. The data processing system of claim 1, wherein said multi-level decoder includes of a plurality of level comparators.

4. The data processing system of claim 1, wherein said data processing unit comprises:
- a multi-level data register electrically connected to said data storage device for storing said data in said m-level data form;
- a multi-level data processor electrically connected to said multi-level data register and said multi-level signal decoder for processing said data stored in said m-level data form in said multi-level data register in response to said command signal and delivering an output signal and an analog address signal;
- an analog-to-digital converter electrically connected to said multi-level data processor for converting said analog signal to a digital signal and delivering a digital address signal; and
- a program counter electrically connected to said analog-to-digital converter and said address pointer for delivering a counting signal to said address pointer in response to said digital address signal and further controlling said address pointer to point toward a corresponding address of said control command storage device and said data storage device.

5. The data processing system of claim 1, wherein said control command storage device is a tri-level memory cell for storing the operational control commands symbolically representing "0", "+" and "−" in small, medium and large voltage-level signal forms, respectively.

6. The data processing system of claim 5, wherein said multi-level decoder comprises:
- a first voltage comparator which is electrically connected to said tri-level memory cell and a first fixed reference voltage for delivering a high-level voltage signal representing "0" operational control command when the voltage-level signal read from said tri-level memory cell is a small voltage-level signal and smaller than said first fixed reference voltage; and
- a second voltage comparator electrically connected to said tri-level memory cell and a second fixed reference voltage for delivering a high-level voltage signal representing "+" operational control command when the voltage-level signal read from said tri-level memory cell is a medium voltage-level signal and smaller than said second fixed reference voltage and delivering a low-level voltage signal representing "−" operational control command when the voltage-level signal read from said tri-level memory cell is a large voltage-level signal and greater than said second fixed reference voltage.

7. The data processing system of claim 6, wherein said data storage device is used to store said m-level voltage signal representing amplitude difference of said output signal.

8. The data processing system of claim 7, wherein said address pointer includes a column address device and a row address device.

9. The data processing system of claim 7, wherein said data processing unit comprises:
- a multi-level data register electrically connected to said data storage device for storing said data in said m-level data form;
- a multi-level data processor electrically connected to said multi-level data register and said multi-level signal decoder for processing data stored in said multi-level data register in said m-level data form in response to said operational control commands symbolically representing "0", "+" and "−", respectively, storing back into said multi-level data register and delivering said output signal and an address signal to control said address pointer to point toward a corresponding address of said control command storage device and said data storage device.

10. The data processing system of claim 7, wherein said address signal is an analog address signal, and between said multi-level data processor and said address pointer further comprises:
- an analog-to-digital converter electrically connected to a multi-level data processor for converting said analog signal to a digital signal and delivering a digital address signal; and
- a program counter which is electrically connected to said analog-to-digital converter and said address pointer for delivering a counting signal to said address pointer in response to said digital address signal and further controlling said address pointer to point toward a corresponding address of said control command storage device and said data storage device.

11. The data processing system of claim 1, wherein said control command storage device is a tri-level memory cell for storing the operational control commands representing "N", "+" and "−" in small, medium and large voltage-level signal forms, respectively.

12. The data processing system of claim 11, wherein said multi-level decoder comprises:
- a first voltage comparator electrically connected to said tri-level memory cell and a first fixed reference voltage for delivering a high-level voltage signal representing "N" operational control command when the voltage-level signal read from said tri-level memory cell is a small voltage-level signal and smaller than said first fixed reference voltage;
- a second voltage comparator electrically connected to said tri-level memory cell and a second fixed reference voltage for delivering a high-level voltage signal representing "+" operational control command when the voltage-level signal read from said tri-level memory cell is a medium voltage-level signal and smaller than said second fixed reference voltage and delivering a low-level voltage signal representing "−" operational control command when the voltage-level signal read from said tri-level memory cell is a large voltage-level signal and greater than said second fixed reference voltage.

13. The data processing system of claim 12, wherein said data storage device is used to store a m-level voltage signal representing amplitude difference of said output signal.

14. The data processing system of claim 13, wherein said address pointer includes a column address device and a row address device.

15. The data processing system of claim 13, wherein said data processing unit comprises:
- a multi-level data register is electrically connected to said data storage device for storing said data in said m-level data form;
- a multi-level data processor electrically connected to said multi-level register and said multi-level signal decoder for processing said data stored in said multi-level data register in said m-level data form in response to said operational control commands representing "0", "+" and "−", respectively, storing back into said multi-level transient storage device and delivering said output signal and an address signal to control said address pointer to point toward a corresponding address of said control command storage device and said data storage device an address.

16. The data processing system of claim 15, wherein said address signal is an analog address signal, and between said multi-level data processor and said address pointer further comprises:
- an analog-to-digital converter electrically connected to a multi-level data processor for converting said analog signal to a digital signal and delivering a digital address signal; and
- a program counter electrically connected to said analog-to-digital converter and said address pointer for delivering a counting signal to said address pointer in response to said digital address signal and further controlling said address pointer to point toward a corresponding address of said control command storage device and said data storage device.

17. The data processing system of claim 1, wherein said control command storage device is a quartet-level memory cell for storing the operational control commands symbolically representing "N", "+", "−", and "0" in four voltage-level signal forms.

18. The data processing system of claim 17, wherein said multi-level decoder comprises:
- a first voltage comparator electrically connected to said quartet-level memory cell and a first fixed reference voltage for delivering a high-level voltage signal representing "N" operational control command when the voltage-level signal read from said quartet-level memory cell is smaller than said first fixed reference voltage;
- a second voltage comparator electrically connected to said quartet-level memory cell and a second fixed reference voltage for delivering a high-level voltage signal representing "+" operational control command when the voltage-level signal read from said quartet-level memory cell is greater than said first fixed reference voltage and smaller than said second fixed reference voltage; and
- a third voltage comparator electrically connected to said quartet-level memory cell and a third fixed reference voltage for delivering a high-level voltage signal representing "−" operational control command when the voltage-level signal read from said quartet-level memory cell is greater than said first second reference voltage and smaller than said third fixed reference voltage and delivering a low-level voltage signal representing "0" operational control command when the voltage-level signal read from said quartet-level memory cell is greater than said third fixed reference voltage.

19. The data processing system of claim 18, wherein said data storage device is used to store a m-level voltage signal representing amplitude difference of said output signal.

20. The data processing system of claim 19, wherein said address pointer includes a column address device and a row address device.

21. The data processing system of claim 19, wherein said data processing unit comprises:
- a multi-level data register electrically connected to said data storage device for storing data in said m-level data form;
- a multi-level data processor electrically connected to said multi-level transient storage device and said multi-level signal decoder for processing said data stored in said multi-level data register in said m-level data form in response to said operational control commands representing "N", "+", "−" and "0", respectively, storing back into said multi-level transient storage device and delivering said output signal and an address signal to control said address pointer to point toward a corresponding address of said control command storage device and said data storage device.

22. The data processing system of claim 21, wherein said address signal is an analog address signal, and between said multi-level data processor and said address pointer further comprises:
- an analog-to-digital converter electrically connected to a multi-level data processor for converting said analog signal to a digital signal and delivering a digital address signal; and
- a program counter electrically connected to said analog-to-digital converter and said address pointer for delivering a counting signal to said address pointer in response to said digital address signal and further controlling said address pointer to point toward a corresponding address of said control command storage device and said data storage device.

23. A data processing system comprising:
- a control command storage device which is digital memory cell for storing a control command in a digital data form;
- a data storage device which is a multi-level memory cell for storing data in an m-level data form, wherein said m is a integer and greater than 2;
- an address pointer connected to said control command storage device and said data storage device for pointing toward a first address of said control command storage device and a second address of said data storage device;
- a digital signal decoder electrically connected to said control command storage device for decoding a control command stored in a digital data form read from a first address of said control command storage device and delivering a control signal representing said control command; and
- a data processing unit which is electrically connected to said digital signal decoder and said data storage device for processing data stored in m-level data form read from said second address of said data storage device and delivering an output signal.

24. The data processing system of claim 23, wherein said address pointer includes a column address device and a row address device.

25. The data processing system of claim 23, wherein said multi-level decoder includes a voltage-level comparator.

26. The data processing system of claim 23, wherein said digital memory cell stores the operational control commands symbolically representing "+" and "−" in small and large voltage-level signal forms, respectively.

27. The data processing system of claim 26, wherein said multi-level decoder comprises:
- a first voltage comparator electrically connected to said digital memory cell and a first fixed reference voltage for delivering a high-level voltage signal representing "+" operational control command when the voltage-level signal read from said digital memory cell is a small voltage-level signal and smaller than said first fixed reference voltage and delivering a low-level voltage signal representing "−" operational control command when the voltage-level signal read from said digital cell is a large voltage-level signal and greater than said first fixed reference voltage .

28. The data processing system of claim 27, wherein said data storage device is used to store said m-level voltage signal representing amplitude difference of said output signal.

29. The data processing system of claim 28, wherein said address pointer includes a column address device and a row address device.

30. The data processing system of claim 28, wherein said data processing unit comprises:

a multi-level data register electrically connected to said data storage device for storing said data in said m-level data form;

a multi-level data processor electrically connected to said multi-level data register and said digital signal decoder for processing said data stored in said multi-level data register in said m-level data form in response to said operational control commands representing "+" and "−", respectively, storing back into said multi-level transient storage device and delivering said output signal.

\* \* \* \* \*